United States Patent [19]

Egawa

[11] Patent Number: 4,535,887
[45] Date of Patent: Aug. 20, 1985

[54] IC PACKAGE CARRIER

[75] Inventor: Yoshinori Egawa, Tokyo, Japan

[73] Assignee: Yamaichi Electric Mfg. Co., Ltd., Tokyo, Japan

[21] Appl. No.: 669,943

[22] Filed: Nov. 9, 1984

[30] Foreign Application Priority Data

Nov. 10, 1983 [JP] Japan .......................... 58-174566[U]

[51] Int. Cl.³ .............................................. B65D 85/62
[52] U.S. Cl. .................................... 206/328; 206/560
[58] Field of Search ............... 206/328, 329, 331, 332, 206/334, 560

[56] References Cited

U.S. PATENT DOCUMENTS

| 3,469,684 | 9/1969 | Keady et al. | 206/330 |
| 3,652,974 | 3/1972 | Tems | 206/329 |
| 4,180,161 | 12/1979 | Henrickson et al. | 206/328 |
| 4,329,642 | 5/1982 | Luthi et al. | 206/328 |
| 4,483,441 | 11/1984 | Akizawa et al. | 206/328 |

Primary Examiner—Joseph Man-Fu Moy
Attorney, Agent, or Firm—Wenderoth, Lind & Ponack

[57] ABSTRACT

An IC package carrier comprises a carrier body having a receiving section defined therein for accommodating an IC package therein, a pair of latch levers disposed on the opposite sides of the receiving section and supported by the walls of the carrier body defining the receiving section as being rotatable about pivots between their respective locking positions and their respective unlocking positions, and engaging means provided on both the carrier body and each of the pair of latch levers for maintaining the IC package in the pinched state when the pair of latch levers are in their respective locking positions.

10 Claims, 5 Drawing Figures

IC PACKAGE CARRIER

BACKGROUND OF THE INVENTION

1. Field of the Invention

The present invention relates to a carrier as a receptacle for an IC package.

2. Description of the Prior Art

There have heretofore been developed a number of carriers of this type, such as those disclosed in U.S. Pat. Nos. 4,435,724, 3,652,974 and 3,529,277, for example.

In case where an IC package as being held within a carrier is subjected to connection with an IC socket, it is required to have almost all portion thereof brought to an exposed state. That is to say, the IC package is pinched only at its extremities, e.g. its corner edges, in a receiving section of the carrier by stopper means such as stopping claws and has its remaining portion brought to an unsupported state. Since such conventional carrier is integrally molded, stopper claws of the carrier interrupt the attachment or detachment of the IC package and are required to be opened with a jig or the like tool in the attachment of the IC package. Thus, such conventional carrier is not easy to operate. Further, the stopper claws are apt to be broken at their base portions during repeated use of the carrier. Therefore, there is now an increased demand for carriers susceptible of easy attachment and detachment of an IC package and, after the IC package has been accommodated therein, capable of reliably pinching the IC package.

OBJECT AND SUMMARY OF THE INVENTION

An object of the present invention is to provide an IC package carrier capable of reliably retaining an IC package and stably maintaining the retention state and easy to operate.

To attain the object described above, according to the present invention, there is provided an IC package carrier which comprises a carrier body; a receiving section defined in the carrier body for accommodating therein an IC package; a pair of latch levers disposed right and left relative to or in front and rear of the receiving section and supported by the walls of the carrier body defining the receiving section as being rotatable about pivots between their respective locking positions and their respective unlocking positions, each of the pair of latch levers having an operation point and a pair of fingers, the operation portion of the latch lever extending from the pivot upwardly of the carrier body and the pair of fingers of the latch lever extending from the pivot downwardly of the carrier body when the latch lever is in its unlocking position, the pair of fingers of the latch lever serving to support the rear surface of the IC package and pinch the IC package in conjunction with the lower surface of the carrier body when the latch lever is in its locking position; and engaging means provided on both the carrier body and each of the pair of latch levers for maintaining the IC package in the pinched state when the pair of latch levers are in their respective locking positions.

The aforementioned object and other objects, advantages and characteristic features of the present invention will become apparent from the further disclosure to be given in detail hereinbelow with reference to the accompanying drawings.

DESCRIPTION OF THE PREFERRED EMBODIMENT

The present invention will now be described with reference to the illustrated embodiment.

Figure 1A:
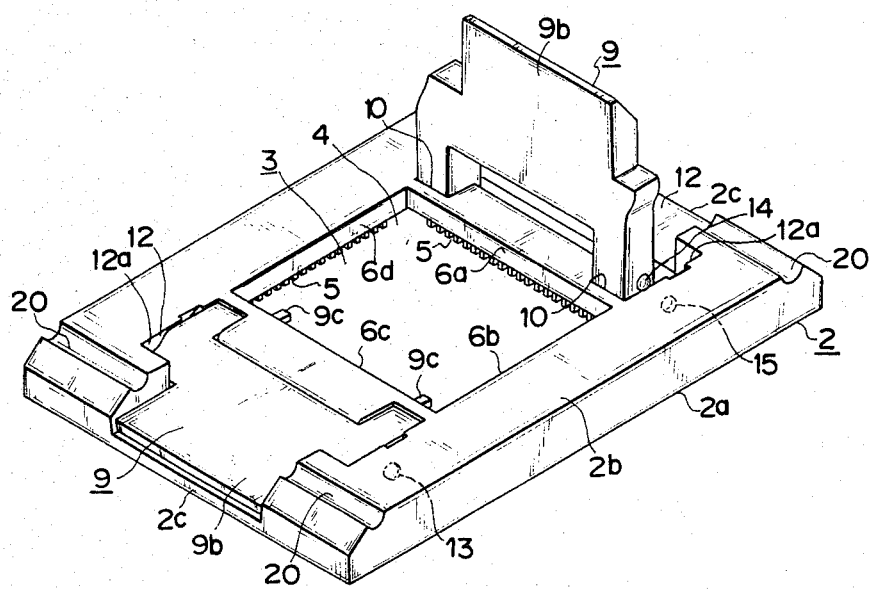
FIG. 1A is a perspective view illustrating one preferred embodiment of the IC package carrier according to the present invention.
Figure 1B:
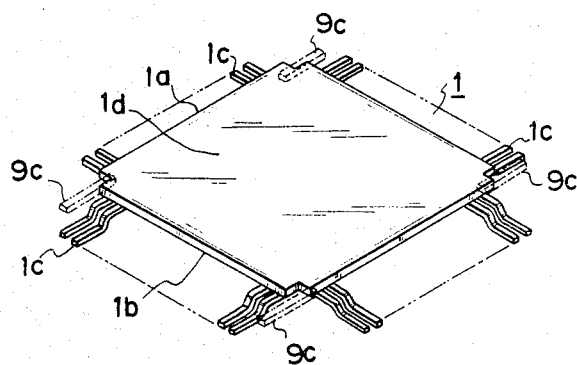
FIG. 1B is a perspective view showing an IC package.
Figure 2:
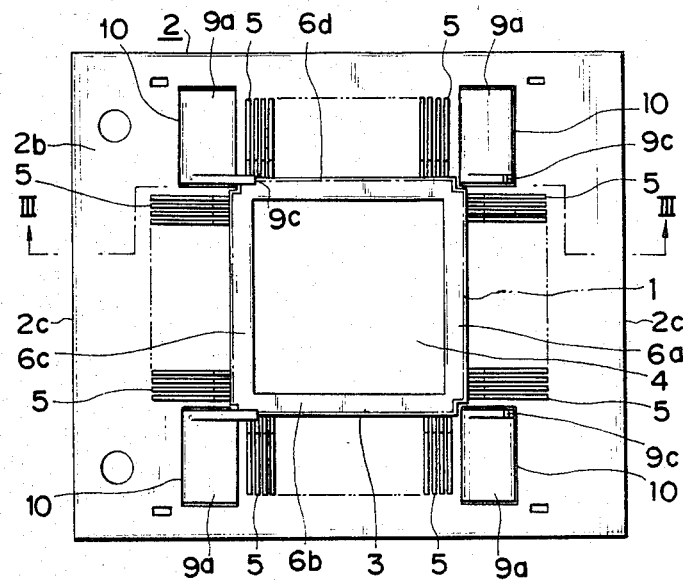
FIG. 2 is a bottom plan view of the IC package carrier according to the present invention.

An IC package 1 comprises, as shown in FIG. 1B, a flat IC substrate 1a of a substantially square shape which has an integrated circuit incorporated therein and has IC leads 1c projected therefrom outwardly.

A carrier body 2 of an IC package carrier according to the present invention is formed of a substantially square flat plate and provided at the bottom center thereof with a receiving section 3 which opens to the lower surface 2a of the carrier body 2 for accommodating therein an IC package and in the four sides of the receiving section 3 with a plurality of IC lead-accommodating grooves 5 which are arranged at right angles relative to the four sides of the receiving section 3 for receiving and positioning the IC leads 1c. In the receiving section 3, there is formed a window 4 having a size smaller than the configuration of the IC package 1. The window 4 opens to the upper surface 2b of the carrier body 2 and communicates with the receiving section 3 to form a stepped area between the receiving section 3 and the window 4. The lower surfaces of support walls 6a through 6d defining the window 4, i.e. the stepped area, support the edge portions of the upper surface 1d of the IC package 1 to prevent the IC package from passing upwardly through the carrier body 2. A pair of latch levers 9 are disposed right and left relative to or in front and rear of the receiving section 3 of the carrier body 2, inserted into through holes 10 formed in the walls of the carrier body 2 defining the receiving section 3, and pivotally supported on the inner walls of the through holes 10 with pivots 11. Each of the latch levers 9 has a base portion 9a at which the pivot 11 is positioned, an operation portion 9b for rotating the latch lever 9 and a pair of fingers 9c for supporting the lower surface 1b of the IC package 1 and pinching the IC package in conjunction with the lower surfaces of the support walls 6a, 6b and 6d or the lower surfaces of the support walls 6c, 6d and 6b, which lower surfaces support the upper surface 1d of the IC package 1 accommodated within the receiving section 3. When the latch lever 9 is in its unlocking position, i.e. in its upright position, the operation portion 9b is projected from the base portion 9a upwardly of the carrier body 2 and the pair of fingers 9c are projected from the base portion 9a downwardly of the carrier body 2.

The IC package 1 accommodated within the receiving section 3 is to be pinched between the carrier body 2 and the fingers 9c of the latch levers 9. The pair of fingers 9c of the latch lever 9 are disposed so that a row of the grooves 5 formed in one side of the receiving section 3 are interposed therebetween and, when the latch lever 9 is in its locking position, extended along the ends of the row of the grooves 5 toward the corner portions of the rear surface of the IC package 1 to cause their leading ends to support the corner portions. The two pairs of the fingers 9c of the pair of latch levers 9 are thus designed not to interfere with the IC leads, and form stable support at the four corners of the IC package.

The upper surface of the walls on which the latch levers 9 are disposed has latch lever-accommodating concaves 12 formed therein for accommodating the operation portion 9b when the latch levers 9 are rotated to their respective locking positions, i.e. lie down on the upper surface of the carrier body 2. These concaves 12 extend to the opposite ends 2c of the carrier body 2, thereby allowing the ends of the operation portions 9b of the latch levers 9 in their respective locking positions to be exposed to the exterior and enabling fingers of an operator to catch hold of the operation portions 9b at the opposite ends 2c of the carrier body. In order to maintain the state wherein the IC package 1 has been pinched between the carrier body 2 and the fingers 9c of the latch levers 9 by rotating the latch levers 9 to their respective locking positions to support the rear surface 1b of the IC package 1 with the fingers 9c, there is provided an engaging mechanism 13 between the carrier body 2 and each of the latch levers 9. In the illustrated embodiment, proper male-to-female engaging means are adopted as the engaging mechanism 13. To be specific, each of the latch levers 9 is provided on the side surface thereof with an engaging projection 14 which protrudes outwardly, whereas the carrier body 2 is provided in the inside walls 12a of the latch lever-accommodating concaves 12 thereof with engaging dents 15 which can either be engaged with or be disengaged from the engaging projections 14.

Figure 4:
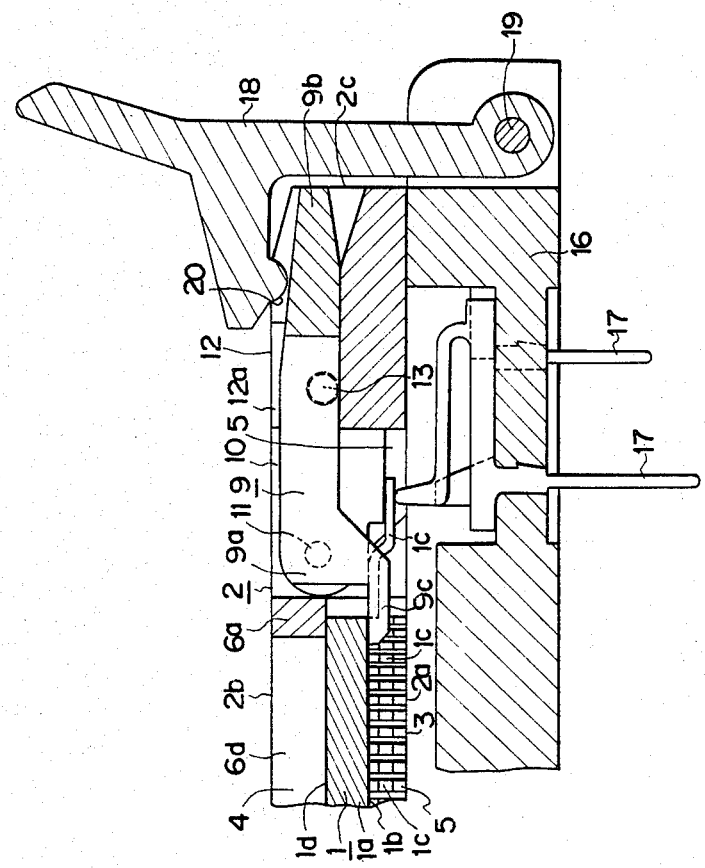
FIG. 4 is a partially enlarged cross-sectional view showing the state assumed when the IC package carrier of the present invention having the IC package accommodated therein has been attached to an IC socket.

FIG. 4 is a partially enlarged cross-sectional view showing the state assumed when the IC package carrier of the present invention having the IC package 1 accommodated therein has been attached to an IC socket 16. In FIG. 4, reference numeral 17 denotes contacts of the IC socket 16 which are brought into contact with the IC leads 1c of the IC package, and numeral 18 denotes a pair of lock levers which are pivotally attached to the opposite sides of the IC socket to be rotated about pivots 19 and which are engaged with engaging grooves 20 formed in the upper surface of the carrier body 2 in the vicinities of the opposite ends 2c to enable the carrier body 2 and the IC socket 16 to be fixed to each other.

Now, the operation for accommodating the IC package 1 within the IC package carrier of the present invention having the aforementioned construction will be described.

Figure 3:
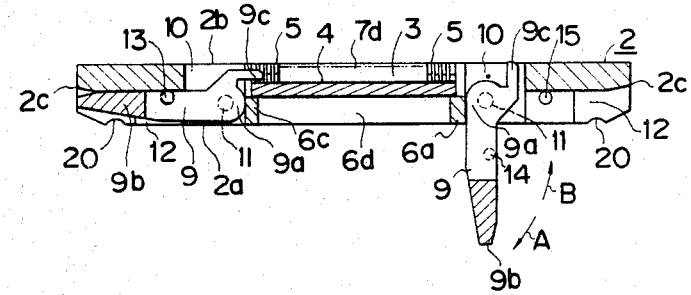
FIG. 3 is a cross-sectional view taken along line III—III in FIG. 2.

The pair of latch levers 9 pivotally supported right and left relative to or in front and rear of the receiving section 3 of the carrier body 2 so as to be rotatable in the directions close to or apart from each other are at first rotated one in the direction of the arrow A in FIG. 3 and the other in the direction close to the one latch lever to rise upright respectively, thereby bringing the fingers 9c to a state wherein the fingers 9c fall outside the receiving section 3. Then, the IC leads 1c of the IC package are inserted into the IC lead-accommodating grooves 5 and, at the same time, the IC substrate 1a is set in position within the receiving section 3 so that the peripheral edge of the upper surface 1d of the IC package 1 is brought into contact with and supported on the lower surfaces of the support walls 6a to 6d.

Subsequently, the latch levers 9 are rotated one in the direction of the arrow B in FIG. 3 and the other in the direction apart from the one latch lever to lie down on the upper surface of the carrier body 2 respectively. Consequently, the two pairs of fingers 9c are directed to the corners of the IC package at which no IC lead exists, and allow their leading ends to support the IC package at the four corners. At this time, the latch levers 9 are fitted in the latch lever-accommodating concaves 12 and the engaging projections 14 of the latch levers 9 are engaged with the engaging dents 15 in the walls of the concaves 12. As a result, the IC package 1 can firmly be pinched between the lower surfaces of the support walls 6a through 6d and the fingers 9c of the latch levers 9 and this state can stably be maintained.

In attaching the carrier body 2 having the IC package 1 accommodated therein as described above to the IC socket, the carrier body 2 is positioned and put on the IC socket 16 by the use of proper means, and the lock levers 18 pivotally attached to the IC socket 16 are rotated about the pivots 19 and engaged with the engaging grooves 20 in the upper surface of the carrier body 2.

Further, the IC package 1 accommodated in the carrier body 2 can easily be detached from the carrier body 2 by inversely operating the latch levers 9.

According to the present invention, as described above, an IC package can be attached to or detached from the carrier body with ease by utilization of the pair of latch levers pivotally supported on the walls of the carrier body which define the receiving section for the IC package so as to be rotatable about the pivots in the directions close to and apart from each other. It is further possible to firmly pinch the IC package between the carrier body and the fingers and to reliably maintain the IC package in the pinched state by means of the engaging mechanism. Therefore, mutual contact between the leads of the IC package and the contacts of the IC socket can be attained and maintained with high reliability. The IC package carrier of the present invention can easily be constructed merely by pivotally supporting the latch levers on the carrier body and, since the IC package carrier is used with the latch levers lying down on the surface of the carrier, it is not so bulky in height. Further, the IC package carrier according to the present invention is very easy to operate because the accommodation, support and detachment of the IC package can be accomplished only by operating rotation of the latch levers, and precludes the conventional problems which have often been experienced by the integrally molded IC package carriers, such as breakage of the stopper claws and accidental drop of the IC package due to external vibration.

The present invention should not be limited to the preferred embodiment described above, but may be modified in various forms without departing the spirit of the invention.

What is claimed is:

1. A carrier for an IC package having rows of IC leads extended therefrom outwardly, which comprises:
   a carrier body having a receiving section defined therein for accommodating therein said IC package,
   a pair of latch levers disposed at the opposed sides of said receiving section and pivotally supported by the walls of said carrier body defining said receiving section as being rotatable about pivots between their respective locking positions and their respective unlocking positions, each of said pair of latch levers comprising a base portion at which the pivot is positioned, an operation portion for operating rotation of the latch lever, and a pair of fingers for supporting the corners of the rear surface of said IC package which are free from interference with said rows of IC leads and pinching said IC package in conjunction with the lower surface of said carrier body when the latch lever is in its locking position, said operation portion extending from said base portion upwardly of said carrier body and said pair of fingers extending from said base portion downwardly of said carrier body when the latch lever is in its unlocking position, and engaging means provided on both said carrier body and each of said pair of latch levers for maintaining said IC package in the pinched state when said pair of latch levers are in their respective locking positions.

2. The carrier according to claim 1, wherein said carrier body is provided in the upper surface thereof with a pair of concaves for accommodating therein said pair of latch levers when said latch levers are in their respective locking positions.

3. The carrier according to claim 2, wherein said pair of concaves are provided in the inside walls thereof with engaging dents, and said pair of latch levers are provided on the side surfaces thereof facing the inside walls of said pair of concaves with engaging projections which are engaged with said engaging dents when said pair of latch levers are in their respective locking positions, and said engaging dents and said engaging projections constitute said engaging means.

4. The carrier according to claim 2, wherein said pair of concaves extend to the opposite ends of said carrier body, thereby allowing the ends of the operation portions of said pair of latch levers to be exposed to the exterior of said carrier body when said pair of latch levers are in their respective locking positions to enable the ends of the operation portions to be operated at the opposite ends of said carrier body.

5. The carrier according to claim 3, wherein said pair of concaves extend to the opposite ends of said carrier body, thereby allowing the ends of the operation portions of said pair of latch levers to be exposed to the exterior of said carrier body when said pair of latch levers are in their respective locking positions to enable the ends of the operation portions to be operated at the opposite ends of said carrier body.

6. The carrier according to claim 1, wherein said carrier body is provided in the upper surface at the opposite ends thereof with engaging grooves for engagement with lock levers of an IC socket.

7. The carrier according to claim 2, wherein said carrier body is provided in the upper surface at the opposite ends thereof with engaging grooves for engagement with lock levers of an IC socket.

8. The carrier according to claim 3, wherein said carrier body is provided in the upper surface at the opposite ends thereof with engaging grooves for engagement with lock levers of an IC socket.

9. The carrier according to claim 4, wherein said carrier body is provided in the upper surface at the opposite ends thereof with engaging grooves for engagement with lock levers of an IC socket.

10. The carrier according to claim 5, wherein said carrier body is provided in the upper surface at the opposite ends thereof with engaging grooves for engagement with lock levers of an IC socket.

* * * * *